United States Patent
Kuo et al.

(10) Patent No.: US 11,528,053 B2
(45) Date of Patent: *Dec. 13, 2022

(54) COMMUNICATION SYSTEM AND METHOD OF DATA COMMUNICATIONS

(71) Applicant: TAIWAN SEMICONDUCTOR MANUFACTURING COMPANY, LTD., Hsinchu (TW)

(72) Inventors: Feng Wei Kuo, Hsinchu (TW); Huan-Neng Chen, Hsinchu (TW); Lan-Chou Cho, Hsinchu (TW); Chewn-Pu Jou, Hsinchu (TW); William Wu Shen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 30 days.

This patent is subject to a terminal disclaimer.

(21) Appl. No.: 17/160,965

(22) Filed: Jan. 28, 2021

(65) Prior Publication Data

US 2021/0152212 A1 May 20, 2021

Related U.S. Application Data

(63) Continuation of application No. 16/773,448, filed on Jan. 27, 2020, now Pat. No. 10,938,443, which is a
(Continued)

(51) Int. Cl.
*H04B 3/04* (2006.01)
*H03H 7/01* (2006.01)
(Continued)

(52) U.S. Cl.
CPC .............. *H04B 3/04* (2013.01); *H03G 3/3078* (2013.01); *H03G 5/28* (2013.01); *H03H 7/0115* (2013.01);
(Continued)

(58) Field of Classification Search
CPC ...... H03G 3/3084; H03G 3/20; H03G 3/3078; H03F 2200/435; H04B 17/21; H04B 1/10;
(Continued)

(56) References Cited

U.S. PATENT DOCUMENTS 6,356,747 B1 3/2002 Miquel et al.
8,279,008 B2 10/2012 Hsieh et al.
(Continued)

*Primary Examiner* — Leila Malek
(74) *Attorney, Agent, or Firm* — Hauptman Ham, LLP

(57) ABSTRACT

A communication system includes a transmitter configured to transmit a modulated signal, a transmission line configured to carry the modulated signal, and a receiver coupled to the transmitter by the transmission line, and configured to receive the modulated signal. The transmitter includes a modulator configured to generate the modulated signal responsive to a data signal and a carrier signal. The receiver includes a demodulator configured to demodulate the modulated signal responsive to a first carrier signal. The demodulator includes a filter and a gain adjusting circuit configured to adjust a gain of the filter, and to generate the set of control signals based on a voltage of the filtered first signal and a voltage of the first signal. The gain adjusting circuit includes a first peak detector coupled to the filter, and configured to detect a peak value of the voltage of the filtered first signal.

20 Claims, 12 Drawing Sheets

Related U.S. Application Data continuation of application No. 16/105,572, filed on Aug. 20, 2018, now Pat. No. 10,554,255, which is a continuation of application No. 15/704,140, filed on Sep. 14, 2017, now Pat. No. 10,056,939, which is a continuation of application No. 14/969,309, filed on Dec. 15, 2015, now Pat. No. 9,768,828.

(51) Int. Cl.

| | | |
|---|---|---|
| *H03G 5/28* | (2006.01) | |
| *H04L 27/22* | (2006.01) | |
| *H03G 3/30* | (2006.01) | |
| *H03H 11/04* | (2006.01) | |
| *H04L 27/38* | (2006.01) | |
| *H04B 17/21* | (2015.01) | |
| *H04B 1/00* | (2006.01) | |
| *H04B 1/10* | (2006.01) | |

(52) U.S. Cl.
CPC ...... *H03H 7/0153* (2013.01); *H03H 11/0405* (2013.01); *H04L 27/22* (2013.01); *H04L 27/38* (2013.01); *H03G 3/3068* (2013.01); *H04B 1/005* (2013.01); *H04B 1/10* (2013.01); *H04B 17/21* (2015.01)

(58) Field of Classification Search
CPC .......... H04B 3/04; H04L 27/22; H04L 27/38; H03L 5/00
USPC ......................................................... 375/268
See application file for complete search history.

(56) References Cited

U.S. PATENT DOCUMENTS

| | | |
|---|---|---|
| 8,427,240 B2 | 4/2013 | Hsieh et al. |
| 8,593,206 B2 | 11/2013 | Chen et al. |
| 8,610,494 B1 | 12/2013 | Jin et al. |
| 8,618,631 B2 | 12/2013 | Jin et al. |
| 8,779,834 B1 | 7/2014 | Foley |
| 9,749,045 B2 * | 8/2017 | Yokoi ................. H04B 10/116 |
| 2003/0067347 A1 | 4/2003 | Miwa |
| 2005/0249264 A1 | 11/2005 | Suzuki et al. |
| 2007/0142016 A1 | 6/2007 | Womac et al. |
| 2008/0081573 A1 | 4/2008 | Hwang |
| 2010/0142606 A1 | 6/2010 | Kato |
| 2012/0092230 A1 | 4/2012 | Hung et al. |
| 2013/0039444 A1 | 2/2013 | Porret et al. |
| 2013/0234305 A1 | 9/2013 | Lin et al. |
| 2014/0132333 A1 | 5/2014 | Jin et al. |
| 2014/0217546 A1 | 8/2014 | Yen et al. |
| 2014/0253262 A1 | 9/2014 | Hsieh et al. |
| 2014/0253391 A1 | 9/2014 | Yen |

\* cited by examiner

COMMUNICATION SYSTEM AND METHOD OF DATA COMMUNICATIONS

PRIORITY CLAIM

The present application is continuation of U.S. application Ser. No. 16/773,448, filed Jan. 27, 2020, now U.S. Pat. No. 10,938,443, issued Mar. 2, 2021, which is a continuation of U.S. application Ser. No. 16/105,572, filed Aug. 20, 2018, now U.S. Pat. No. 10,554,255, issued Feb. 4, 2020, which is a continuation of U.S. application Ser. No. 15/704,140, filed Sep. 14, 2017, now U.S. Pat. No. 10,056,939, issued Aug. 21, 2018, which is a continuation of U.S. application Ser. No. 14/969,309, filed Dec. 15, 2015, now U.S. Pat. No. 9,768,828, issued Sep. 19, 2017, which are incorporated herein by reference in their entireties.

BACKGROUND

In an electrical system, there are many integrated circuit (IC) chips arranged in one or more IC packages or many electrical devices, such as a memory, an analog-to-digital converter, wireless communication devices, or an application processor, in a chip. In some applications, data communications among different IC chips and/or different electrical devices are performed based on one or more communication protocols, such as a Serial Peripheral Interface (SPI) protocol or an Inter-Integrated Circuit ($I^2C$) protocol. A radio frequency interconnect (RFI) has been implemented that links the devices to perform communication between the devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
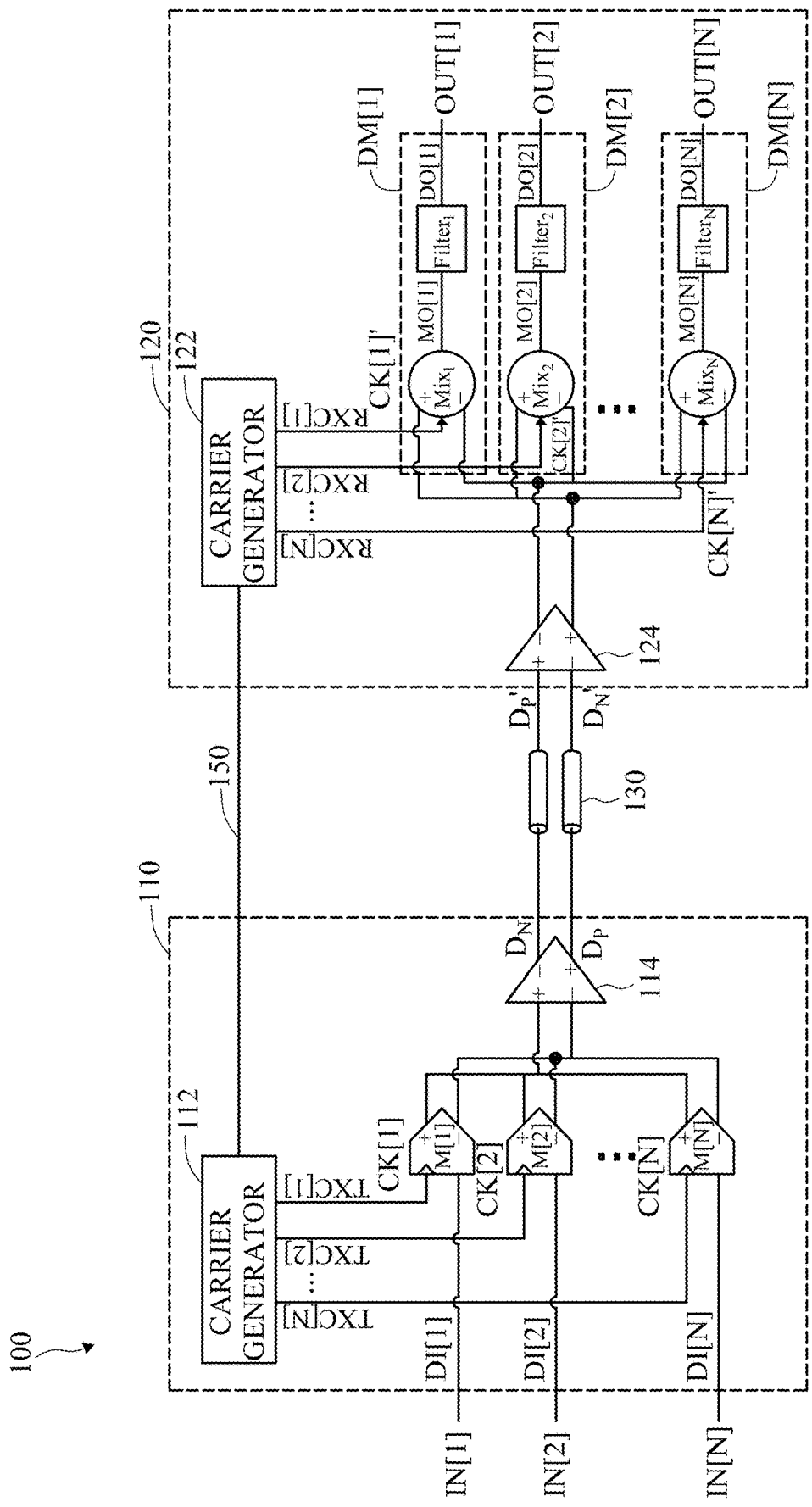
FIG. 1 is a block diagram of a data communication system, in accordance with some embodiments.

The following disclosure provides different embodiments, or examples, for implementing features of the provided subject matter. Specific examples of components and arrangements are described below to simplify the present disclosure. These are, of course, merely examples and are not limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The RFI discussed herein connects devices by a transmission line. In some embodiments, the individual components are on a single semiconductor substrate. In some embodiments, the individual components are on separate semiconductor substrates. In some embodiments, the devices include at least one of a memory device; a wireless communication device, e.g., a Bluetooth® module, a Zigbee® module, an IEEE 802.11 wireless networking module, or another suitable wireless communication device; an analog-to-digital converter, a digital-to-analog converter, a sensor module, a discrete application processor for performing operations in a low power state, a hardware processor, a memory controller, or another suitable device.

In accordance with some embodiments, a communication system includes a carrier generator configured to generate a first carrier signal and a demodulator configured to demodulate a modulated signal responsive to the first carrier signal. The demodulator includes a filter and a gain adjusting circuit. The filter is configured to filter a first signal. The first signal is a product of the first carrier signal and the modulated signal. The filter has a first cutoff frequency and a gain. The gain of the filter is controlled by a set of control signals. The gain adjusting circuit is configured to adjust the gain of the filter based on a voltage of the filtered first signal or a voltage of a second signal. The adjustable gain circuit is configured to generate the set of control signals.

Distortion introduced by the filter of the demodulator is compensated by adjusting the gain of the filter. Distortion is attributed to process, voltage and/or temperature (PVT) variations of the demodulator. In some embodiments, compared with a receiver not using the gain adjusting circuit, the receiver according to the present disclosure consumes less power by automatically adjusting the gain and the frequency response of the filter. In some embodiments, the frequency response of the filter of the present disclosure is automatically adjusted to overcome PVT variations. In some embodiments, the frequency response of the filter of the present disclosure is consistent regardless of PVT variations.

FIG. 1 is a block diagram of a data communication system 100, in accordance with some embodiments. Data communication system 100 includes a transmitter 110, a receiver 120 and a transmission line 130. Transmission line 130 electrically couples transmitter 110 and receiver 120. In addition to transmission line 130, one or more channels 150 electrically couple transmitter 110 and receiver 120. In some embodiments, channel 150 is not used to electrically couple transmitter 110 and receiver 120. Data communication system 100 is configured to transmit data communications, signaling communications or command communications.

In some embodiments, transmitter 110 and receiver 120 are in different IC chips having different IC packages. In some embodiments, transmitter 110 and receiver 120 are in different IC chips within a common IC package. In some embodiments, transmitter 110 and receiver 120 are in different electrical devices of a common IC chip.

Transmitter 110 is coupled to N input data lines IN[1], IN[2], and IN[N], where N is a positive integer equal to or greater than 1. Each data line of input data lines IN[1], IN[2], and IN[N] is configured to carry input data in the form of data signals DI[1], DI[2], or DI[N]. Transmitter 110 is configured to receive input data in the form of data signals DI[1], DI[2], or DI[N] via input data lines IN[1], IN[2], and IN[N], modulate the input data in the form of data signals DI[1], DI[2], or DI[N] based on a different carrier signal CK[1], CK[2], and CK[N] for each of the input data lines IN[1], IN[2], and IN[N], and transmit the modulated data in the form of a modulated data signal to receiver 120.

Transmitter 110 includes a carrier generator 112, N modulators M[1], M[2], and M[N], and a driver amplifier 114. Carrier generator 112 is connected with driver amplifier 114 via the N modulators M[1], M[2], and M[N].

Carrier generator 112 is configured to generate N carrier signals CK[1], CK[2], and CK[N] on corresponding carrier lines TXC[1], TXC[2], and TXC[N]. Each carrier signal of the carrier signals CK[1], CK[2], and CK[N] is a continuous wave signal having a different fundamental frequency.

Each modulator of modulators M[1], M[2], and M[N] has a clock input terminal coupled with a corresponding carrier line of carrier lines TXC[1], TXC[2], and TXC[N] and a data terminal coupled with a corresponding data line of input data lines IN[1], IN[2], and IN[N]. Each modulator of modulators M[1], M[2], and M[N] is configured to output modulated data to driver amplifier 114 in a form of a pair of differential signals.

Driver amplifier 114 is configured to generate an amplified modulated signal to be transmitted on transmission line 130 based on various modulated input data from modulators M[1], M[2], and M[N]. In some embodiments, a summing block (not shown) is connected between the modulators M[1], M[2], and M[N] and driver amplifier 114. In some embodiments, a multiplexer (not shown) is connected between the modulators M[1], M[2], and M[N] and driver amplifier 114.

Transmission line 130 includes two conductive lines suitable to transmit a signal in a differential mode. The modulated signal transmitted on transmission line 130 is also in a form of a pair of differential signals $D_P$ and $D_N$ at the output terminals of driver amplifier 114. In some embodiments, driver amplifier 114 is a low noise amplifier (LNA).

Receiver 120 is coupled to transmission line 130, and N output data lines OUT[1], OUT[2], and OUT[N]. Each data line of output data lines OUT[1], OUT[2], and OUT[N] is configured to carry demodulated data in the form of a demodulated data signal DO[1], DO[2], or DO[N]. Receiver 120 includes a carrier generator 122, N demodulators DM[1], DM[2], and DM[N], and a receiver amplifier 124.

Carrier generator 122 is configured to generate N carrier signals CK[1]', CK[2]', and CK[N]'. Each carrier signal of carrier signals CK[1]', CK[2]', and CK[N]' and a corresponding carrier signal of carrier signals CK[1], CK[2], and CK[N] have the same carrier clock frequency, or a difference thereof is within a predetermined engineering tolerance.

A phase error between carrier signals CK[1]', CK[2]', and CK[N]' and the amplified modulated signal from receiver amplifier 124 is preemptively compensated for by carrier generator 122. In some embodiments, carrier generator 112 and carrier generator 122 are coupled through channel 150 to exchange control information, sample carrier signals, or other carrier-related information. In some embodiments, channel 150 is a physical channel that includes one or more conductive lines. In some embodiments, channel 150 is a logical channel, and the actual electrical signals are exchanged through transmission line 130.

Receiver amplifier 124 is configured to receive an amplified modulated signal transmitted on transmission line 130. The amplified modulated signal received by receiver amplifier 124 from transmission line 130 is also in a form of a pair of differential signals $D_P'$ and $D_N'$ at the input terminals of receiver amplifier 124. Compared with the pair of differential signals $D_P$ and $D_N$, the pair of differential signals $D_P'$ and $D_N'$ have a delay and a channel distortion caused by transmission line 130. In some embodiments, receiver amplifier 124 is an LNA. Receiver amplifier 124 is also configured to output amplified modulated signal to demodulators DM[1], DM[2], and DM[N]. In some embodiments, a summing block (not shown) is connected between the demodulators DM[1], DM[2], and DM[N] and receiver amplifier 124. In some embodiments, a multiplexer (not shown) is connected between the demodulators DM[1], DM[2], and DM[N] and receiver amplifier 124.

Demodulators DM[1], DM[2], and DM[N] are coupled to receiver amplifier 124 to receive the amplified modulated signal and are coupled to carrier generator 122 through corresponding carrier lines RXC[1], RXC[2], and RXC[N]. Each demodulator of demodulators DM[1], DM[2], and DM[N] outputs a demodulated data signal DO[1], DO[2], and DO[N] based on the amplified modulated signal from receiver amplifier 124 and carrier signals CK[1]', CK[2]', and CK[N]' on corresponding carrier lines RXC[1], RXC[2], and RXC[N]. Each demodulator of demodulators DM[1], DM[2], and DM[N] is coupled to a corresponding data line of output data lines OUT[1], OUT[2], and OUT[N].

In some embodiments, each modulator of modulators M[1], M[2], and M[N] modulates the input data based on a Quadrature Amplitude Modulation (QAM) scheme having a predetermined number of constellation points. In some embodiments, the predetermined number of constellation points ranges from 64 to 1026. Demodulators DM[1], DM[2], and DM[N] are configured to match the modulation scheme of the corresponding modulators M[1], M[2], and M[N]. In some embodiments, modulators M[1], M[2], and M[N] and corresponding demodulators DM[1], DM[2], and DM[N] are configured based on a Phase Shift Keying (PSK) scheme or other suitable modulation schemes. In some embodiments, modulators M[1], M[2], and M[N] and corresponding demodulators DM[1], DM[2], and DM[N] are implemented to have two or more different modulation schemes or settings.

Demodulators DM[1], DM[2], and DM[N] include mixers $MIX_1$, $MIX_2$, and $MIX_N$ and filters $Filter_1$, $Filter_2$, and $Filter_N$. Each demodulator of demodulators DM[1], DM[2], and DM[N] includes a corresponding mixer $MIX_1$, $MIX_2$, and $MIX_N$ and a corresponding filter $Filter_1$, $Filter_2$, and $Filter_N$.

Mixers $MIX_1$, $MIX_2$, and $MIX_N$ are coupled to receiver amplifier 124 to receive the amplified modulated signal and are coupled to carrier generator 122 through corresponding carrier lines RXC[1], RXC[2], and RXC[N]. Each mixer of mixers $MIX_1$, $MIX_2$, and $MIX_N$ outputs a mixed data signal MO[1], MO[2], and MO[N] based on the amplified modulated signal from receiver amplifier 124 and carrier signals CK[1]', CK[2]', and CK[N]' on corresponding carrier lines RXC[1], RXC[2], and RXC[N]. In some embodiments, one or more mixed data signals of the mixed data signal MO[1], MO[2], and MO[N] corresponds to an intermediate frequency (IF) signal.

Filters $Filter_1$, $Filter_2$, and $Filter_N$ are coupled to Mixers $MIX_1$, $MIX_2$, and $MIX_N$ to receive the mixed data signals MO[1], MO[2], and MO[N]. Each filter of filters $Filter_1$, $Filter_2$, and $Filter_N$ outputs a corresponding demodulated data signal DO[1], DO[2], and DO[N]. Each demodulated data signal of the demodulated data signal DO[1], DO[2], and DO[N] corresponds to a filtered version of the mixed data signal MO[1], MO[2], and MO[N].

Each filter of filters $Filter_1$, $Filter_2$, and $Filter_N$ is coupled to a corresponding data line of output data lines OUT[1], OUT[2], and OUT[N]. In some embodiments, one or more filters of the filters $Filter_1$, $Filter_2$, and $Filter_N$ corresponds to a band pass filter. In some embodiments, one or more filters of the filters $Filter_1$, $Filter_2$, and $Filter_N$ correspond to a low pass filter.

Figure 2A:
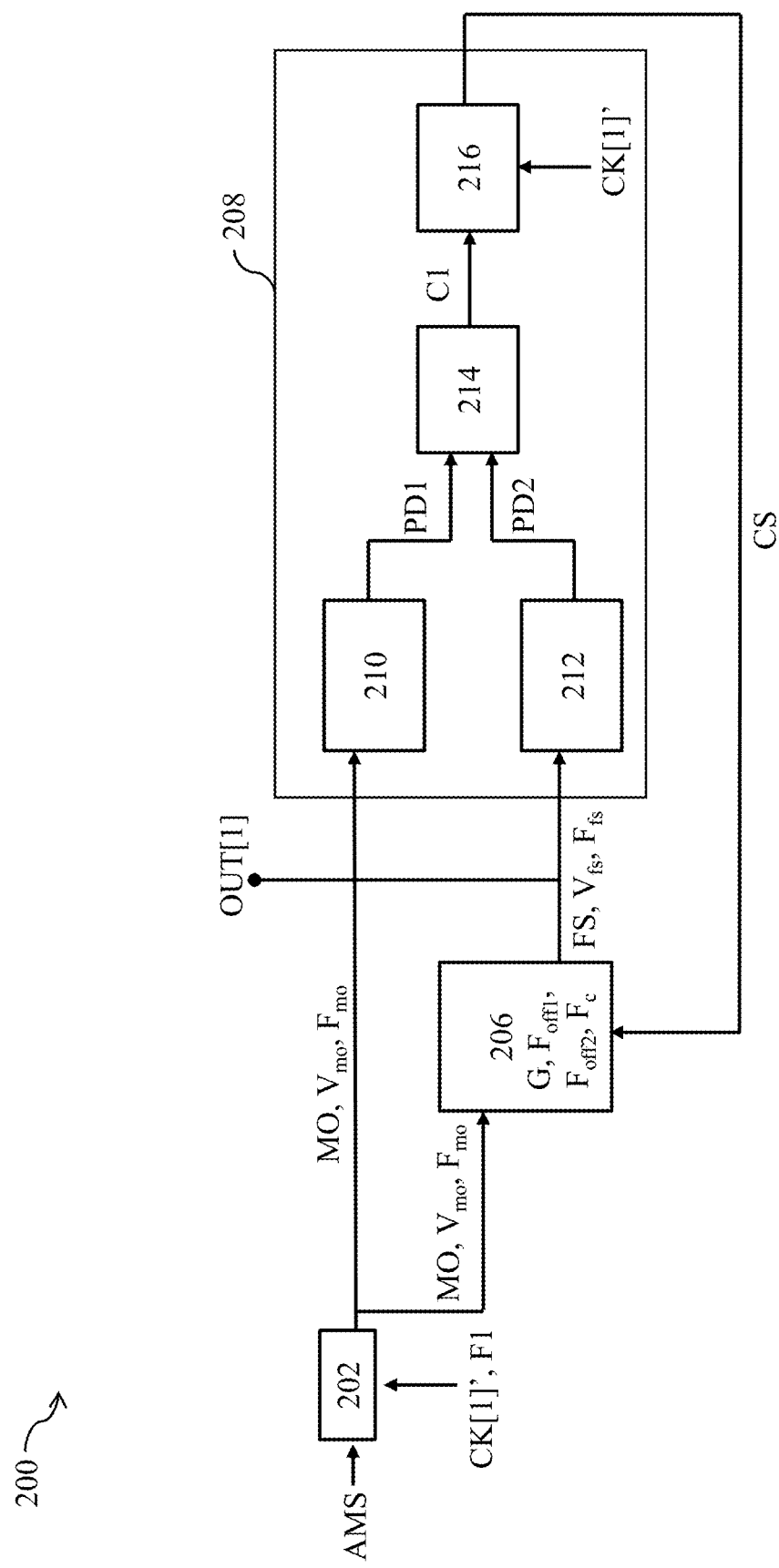
FIG. 2A is a block diagram of a demodulator usable in the data communication system in FIG. 1, in accordance with some embodiments.

FIG. 2A is a block diagram of a demodulator 200 usable as a demodulator DM (FIG. 1) in the data communication system 100, in accordance with some embodiments. Demodulator 200 includes a mixer 202, a filter 206, and a gain adjusting circuit 208.

Mixer 202 is usable as a mixer $MIX_1$ (FIG. 1). Filter 206 is usable as a filter $Filter_1$ (FIG. 1). Mixed data signal MO is an embodiment of mixed data signal MO[1] (FIG. 1).

Demodulator 200 is configured to demodulate an amplified modulated signal AMS based on carrier signal CK[1]'. Carrier signal CK[1]' has a first carrier frequency F1.

Mixer 202 is connected to filter 206 and gain adjusting circuit 208. Mixer 202 is configured to receive carrier signal CK[1]' and amplified modulated signal AMS. Mixer 202 is configured to generate a mixed data signal MO based on the product of carrier signal CK[1]' and amplified modulated signal AMS. Mixed data signal MO has a voltage $V_{mo}$ and a plurality of frequencies including frequency $F_{mo}$.

Filter 206 is connected to mixer 202 and gain adjusting circuit 208. Filter 206 is configured to receive mixed data signal MO and a set of control signals CS. Filter 206 is configured to filter the mixed data signal MO. Filter 206 is configured to output a filtered mixed data signal FS based on the mixed data signal MO. Filtered mixed data signal FS has a frequency $F_{fs}$ and a voltage $V_{fs}$. In some embodiments, the frequency $F_{fs}$ of filtered mixed data signal FS is a fundamental frequency. In some embodiments, filtered mixed data signal FS includes a plurality of frequencies and the frequency $F_{fs}$ is a portion of the plurality of frequencies.

Filter 206 is configured to have a first cutoff frequency $F_{off1}$, a bandwidth BW and a gain G. In some embodiments, frequency $F_{fs}$ of the filtered mixed data signal FS is less than a first cutoff frequency $F_{off1}$. The gain G of filter 206 is controlled by the set of control signals CS. The gain G of filter 206 is adjusted based on the set of control signals CS.

In some embodiments, filter 206 is a low pass filter having a center frequency $F_C$ equal to 0 hertz (Hz). In some embodiments, the first cutoff frequency $F_{off1}$ defines the bandwidth BW of the low pass filter.

In some embodiments, filter 206 is a band pass filter having a center frequency $F_C$, first cutoff frequency $F_{off1}$, and a second cutoff frequency $F_{off2}$. In some embodiments, first cutoff frequency $F_{off1}$ and second cutoff frequency $F_{off2}$ of the band pass filter define the bandwidth BW. In some embodiments, first cutoff frequency $F_{off1}$ is greater than second cutoff frequency $F_{off2}$. In some embodiments, the bandwidth BW of the band pass filter is adjusted by adjusting the first cutoff frequency $F_{off1}$ or the second cutoff frequency $F_{off2}$. In some embodiments, the center frequency $F_C$ of the band pass filter is less than the first cutoff frequency $F_{off1}$, and the center frequency $F_C$ of the band pass filter is greater than the second cutoff frequency $F_{off2}$ of the band pass filter. In some embodiments, the frequency $F_{fs}$ of filtered mixed data signal FS is greater than the second cutoff frequency $F_{off2}$.

In some embodiments, filter 206 is a Butterworth filter of any order, a Chebyshev Type 1 filter of any order or a Chebyshev Type 2 filter of any order. In some embodiments, filter 206 is an elliptic filter, a Bessel-Thomson filter or a Gaussian filter.

Figure 7:
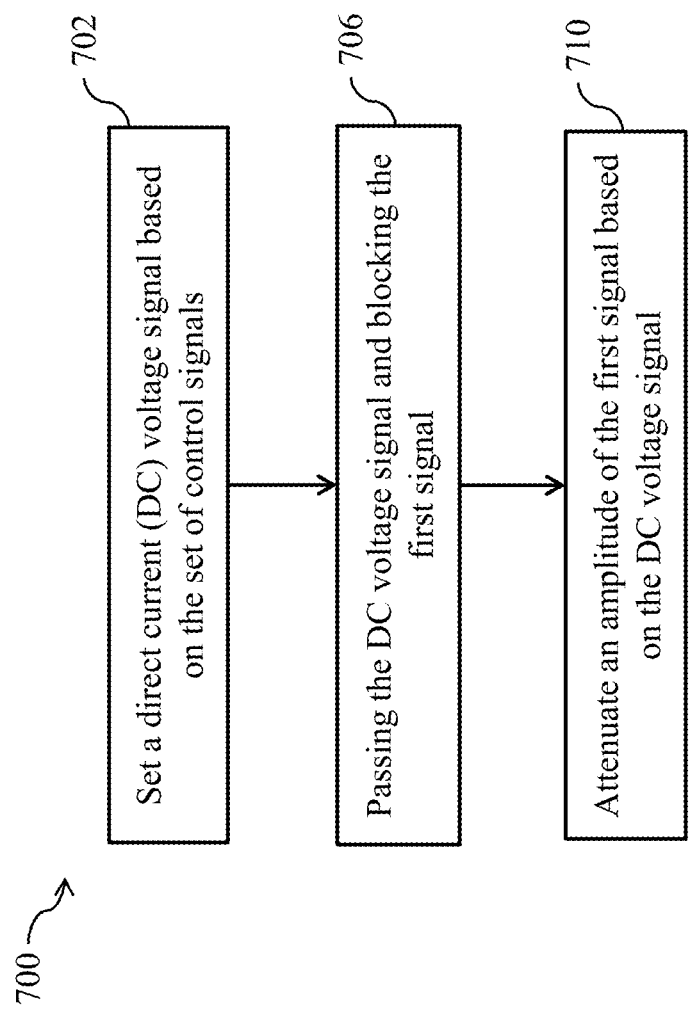
FIG. 7 is a flowchart of a method of adjusting a gain of a filter, in accordance with some embodiments.

Gain adjusting circuit 208 is connected to mixer 202 and filter 206. Gain adjusting circuit 208 is configured to adjust the gain G of filter 206 based on a peak value of the voltage $V_{fs}$ of filtered mixed data signal FS and a peak value of the voltage $V_{mo}$ of mixed data signal MO. Gain adjusting circuit 208 is configured to generate the set of control signals CS. The set of control signals CS includes one or more control signals. Each control signal includes one or more bits. In some embodiments, if gain adjusting circuit 208 determines that the peak value of the voltage $V_{mo}$ of the mixed data signal MO is equal to the voltage $V_{fs}$ of the filtered mixed data signal FS, the set of control signals CS associated with filter 206 are stored in memory 704 (FIG. 7). In some embodiments, if gain adjusting circuit 208 determines that the peak value of the voltage $V_{mo}$ of the mixed data signal MO is not equal to the voltage $V_{fs}$ of the filtered mixed data signal FS, the gain G of filter 206 is adjusted.

Gain adjusting circuit 208 includes a first peak detector 210, a second peak detector 212, a comparator 214 and a controller 216.

First peak detector 210 is connected to mixer 202 and comparator 214. First peak detector 210 is configured to detect a peak value of the voltage $V_{mo}$ of mixed data signal MO. First peak detector 210 is configured to output a signal PD1 based on the voltage $V_{mo}$ of mixed data signal MO. The voltage $V_{mo}$ of mixed data signal MO is an alternating current (AC) signal. Signal PD1 is a direct current (DC) signal. In some embodiments, signal PD1 is a DC voltage signal that corresponds to the peak value of the voltage $V_{mo}$ of mixed data signal MO. First peak detector 210 is configured as a low pass filter with a slow response time.

Second peak detector 212 is connected to filter 206, comparator 214 and output data line OUT[1]. Second peak detector 212 is configured to detect a peak value of the voltage $V_{fs}$ of filtered mixed data signal FS. Second peak detector 212 is configured to output a signal PD2 based on the voltage $V_{fs}$ of filtered mixed data signal FS. The voltage $V_{fs}$ of filtered mixed data signal FS is an AC signal. Signal PD2 is a DC signal. In some embodiments, signal PD2 is a DC voltage signal that corresponds to the peak value of the voltage $V_{fs}$ of filtered mixed data signal FS. Second peak detector 212 is configured as a low pass filter with a slow response time.

Comparator 214 is connected to first peak detector 210, second peak detector 212 and controller 216. Comparator 214 is configured to receive signal PD1 from first peak detector 210, and signal PD2 from second peak detector 212. Comparator 214 is configured to detect a relationship between signal PD1 and signal PD2. Comparator 214 is configured to compare signal PD1 and signal PD2. Comparator 214 is configured to output a signal C1 to the controller 216. In some embodiments, signal C1 corresponds to the larger value between signal PD1 and signal PD2. Signal C1 corresponds to a digital signal with a binary value.

Controller 216 is connected to filter 206 and comparator 210. Controller 216 is configured to receive signal C1 from comparator 214 and carrier signal CK[1]'. Controller 216 is configured to generate the set of control signals CS. Controller 216 is configured to output the set of control signals CS to filter 206. In some embodiments, controller 216 is configured to generate the set of control signals CS based on signal C1. In some embodiments, controller 216 is configured to generate the set of control signals CS based on the relationship between the peak value of the voltage $V_{fs}$ of filtered mixed data signal FS and the peak value of the voltage $V_{mo}$ of mixed data signal MO.

The set of control signals CS is stored in memory 704 (FIG. 7) in controller 216. In some embodiments, each set of control signals CS has a corresponding configuration of the gain adjusting circuit 208. In some embodiments, controller 216 is a finite state machine. In some embodiments, controller 216 corresponds to a programmable logic device, a programmable logic controller, one or more logic gates, one or more flip-flops or one or more relay devices.

Figure 2B:
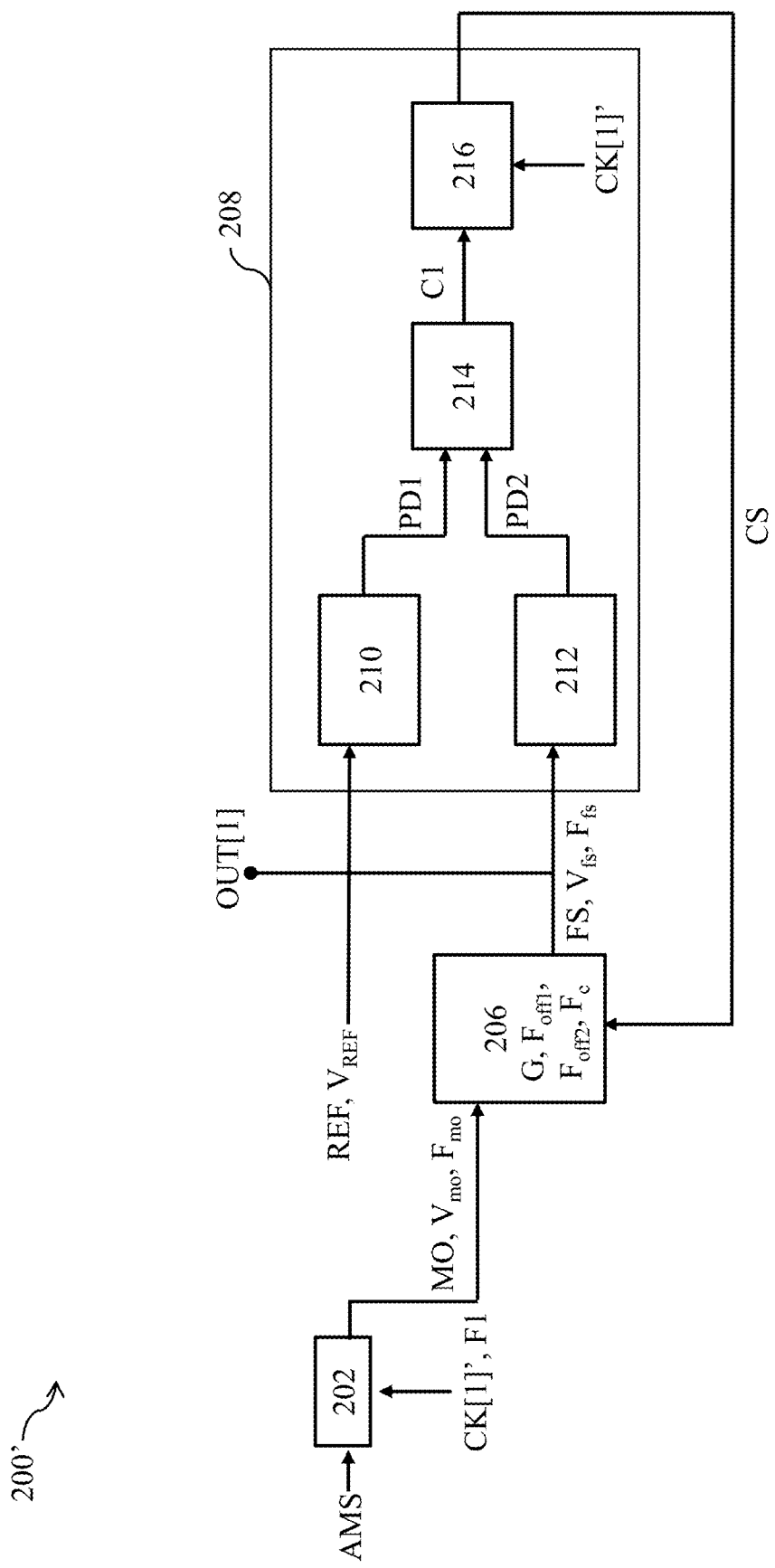
FIG. 2B is a block diagram of a demodulator usable in the data communication system in FIG. 1, in accordance with some embodiments.

FIG. 2B is a block diagram of a demodulator 200' usable as a demodulator DM (FIG. 1) in the data communication system 100, in accordance with some embodiments. Demodulator 200' is an embodiment of demodulator 200 (FIG. 2A).

Mixer 202 is usable as a mixer $MIX_1$ (FIG. 1). Filter 206 is usable as a filter $Filter_1$ (FIG. 1). Mixed data signal MO is an embodiment of mixed data signal MO[1] (FIG. 1). Reference signal REF is an embodiment of mixed data signal MO (FIG. 2A).

In comparison with demodulator 200 (FIG. 2A), first peak detector 210 of demodulator 200' does not receive mixed data signal MO from mixer 202. In comparison with demodulator 200 (FIG. 2A), first peak detector 210 of demodulator 200' is configured to receive a reference signal REF. Reference signal REF has a reference voltage $V_{ref}$. By using the reference signal REF as an input, the first peak detector 210 of demodulator 200' is configured to detect a peak value of the reference signal REF. By using the reference signal REF as an input, the first peak detector 210 of demodulator 200' is configured to detect a peak value over a range of values different than that provided by the voltage $V_{mo}$ of mixed data signal MO.

Figure 3A:
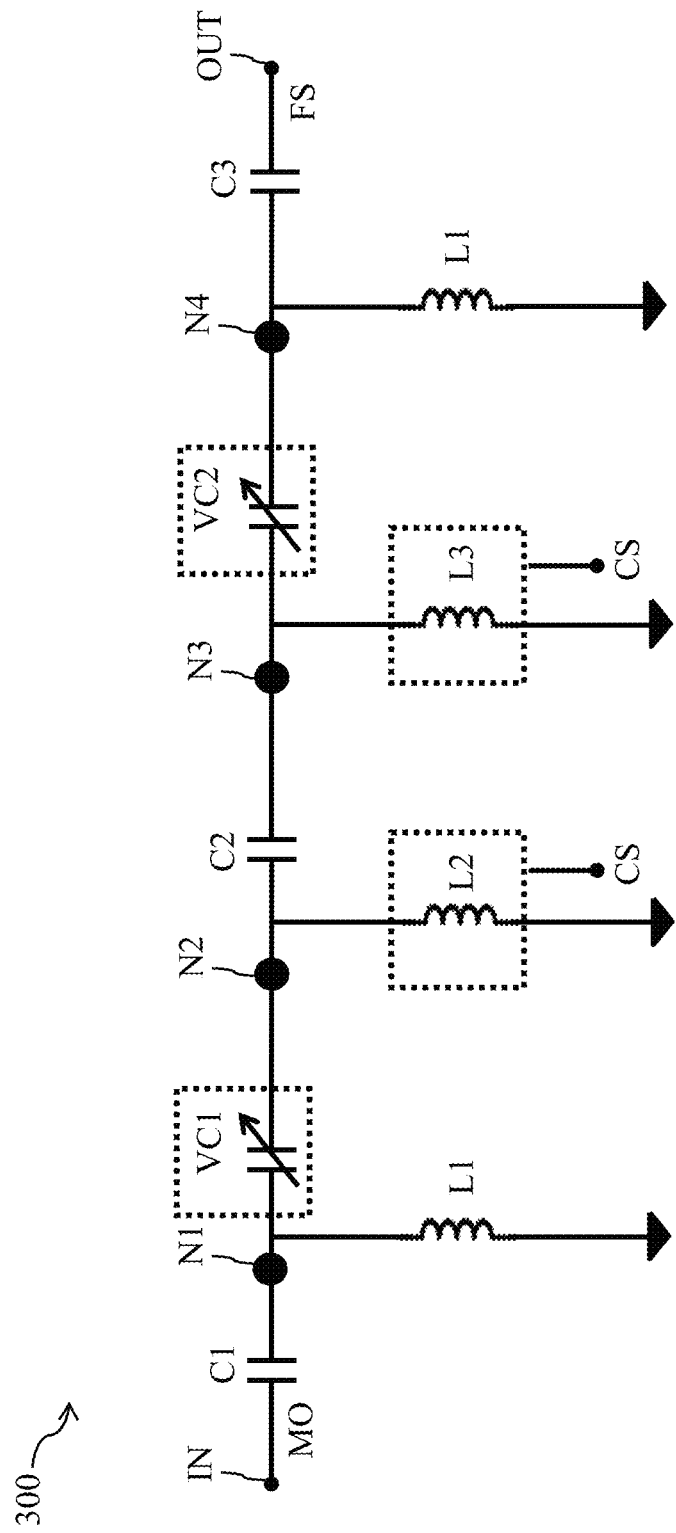
FIG. 3A is a circuit diagram of a filter usable in the demodulator in FIGS. 2A-2B, in accordance with some embodiments.

FIG. 3A is a circuit diagram of a filter 300 usable in demodulator 200, 200' (FIGS. 2A-2B), in accordance with some embodiments. Filter 300 is usable as filter $Filter_1$ (FIG. 1). Filter 300 is usable as filter 206 (FIGS. 2A-2B).

Filter 300 is configured to receive mixed data signal MO on input port IN and a set of control signals CS. Filter 300 is configured to output filtered mixed data signal FS on output port OUT based on the set of control signals CS. The frequency response of filter 300 is adjusted based on adjusting a gain of the filter 300. In some embodiments, the frequency response of filter 300 is adjusted based on adjusting an amplitude of the voltage $V_{fs}$ of the filtered output signal FS based on the set of control signals CS.

Filter 300 includes a first capacitor C1 connected in series with a first variable capacitor VC1, a second capacitor C2, a second variable capacitor VC2, and a third capacitor C3. Filter 300 further includes a plurality of inductors L1, a first inductor L2 and a second inductor L3. Filter 300 also includes an input port IN connected at one side of first capacitor C1 opposite first variable capacitor VC1. Filter 300 also includes an output port OUT connected at one side of third capacitor C3 opposite second variable capacitor VC2.

An inductor of the plurality of inductors L1 is connected between a ground terminal and a first node N1. First node N1 connects first capacitor C1 and first variable capacitor VC1.

First inductor L2 is connected between the ground terminal and a second node N2. Second node N2 connects second capacitor C2 and first variable capacitor VC1.

Second inductor L3 is connected between the ground terminal and a third node N3. Third node N3 connects second capacitor C2 and second variable capacitor VC2.

An inductor of the plurality of inductors L1 is connected between the ground terminal and fourth node N4. Fourth node N4 connects third capacitor C3 and second variable capacitor VC2.

First inductor L2 or second inductor L3 is configured to receive set of control signals CS. First inductor L2 or second inductor L3 is configured to adjust an amplitude of the voltage $V_{fs}$ of the filtered output signal FS based on the set of control signals CS. In some embodiments, an inductance value of first inductor L2 or second inductor L3 is adjusted by the set of control signals CS. In some embodiments, a reactance value or an equivalent resistance value of first inductor L2 or second inductor L3 is adjusted by the set of control signals CS. In some embodiments, a gain G of filter 300 is adjusted based on the reactance value or the equivalent resistance value of first inductor L2 or second inductor L3.

In some embodiments, filter 300 includes a greater or lesser number of inductors (e.g., first inductor L2 or second inductor L3) other than that shown in FIG. 3A. In some embodiments, first inductor L2 or second inductor L3 corresponds to an adjustable inductor array configured to set an equivalent inductance value based on the set of control signals CS. In some embodiments, a value of first inductor L2 is equal to a value of second inductor L3.

In some embodiments, the frequency response of filter 300 is adjusted based on adjustment of the value of the first variable capacitor VC1 or the second variable capacitor VC2. In some embodiments, by adjusting the values of the first variable capacitor VC1 or the second variable capacitor VC2, the first cutoff frequency, the center frequency, the second cutoff frequency or the bandwidth of filter 300 are adjusted. In some embodiments, filter 300 includes a greater or lesser number of variable capacitors (e.g., first variable capacitor VC1 or second variable capacitor VC2) other than that shown in FIG. 3A.

In some embodiments, at least one of a value of first capacitor C1, a value of second capacitor C2 or a value of third capacitor C3 is equal to at least one of the value of first capacitor C1, the value of second capacitor C2 or the value of third capacitor C3. In some embodiments, at least one of a value of first capacitor C1, a value of second capacitor C2 or a value of third capacitor C3 is different from at least one of the value of first capacitor C1, the value of second capacitor C2 or the value of third capacitor C3. In some embodiments, a value of first variable capacitor VC1 is equal to a value of second variable capacitor VC2. In some embodiments, the value of first variable capacitor VC1 is different from the value of second variable capacitor VC2. In some embodiments, first variable capacitor VC1 or second variable capacitor VC2 corresponds to a metal oxide semiconductor capacitor (MOSCAP).

Figure 3B:
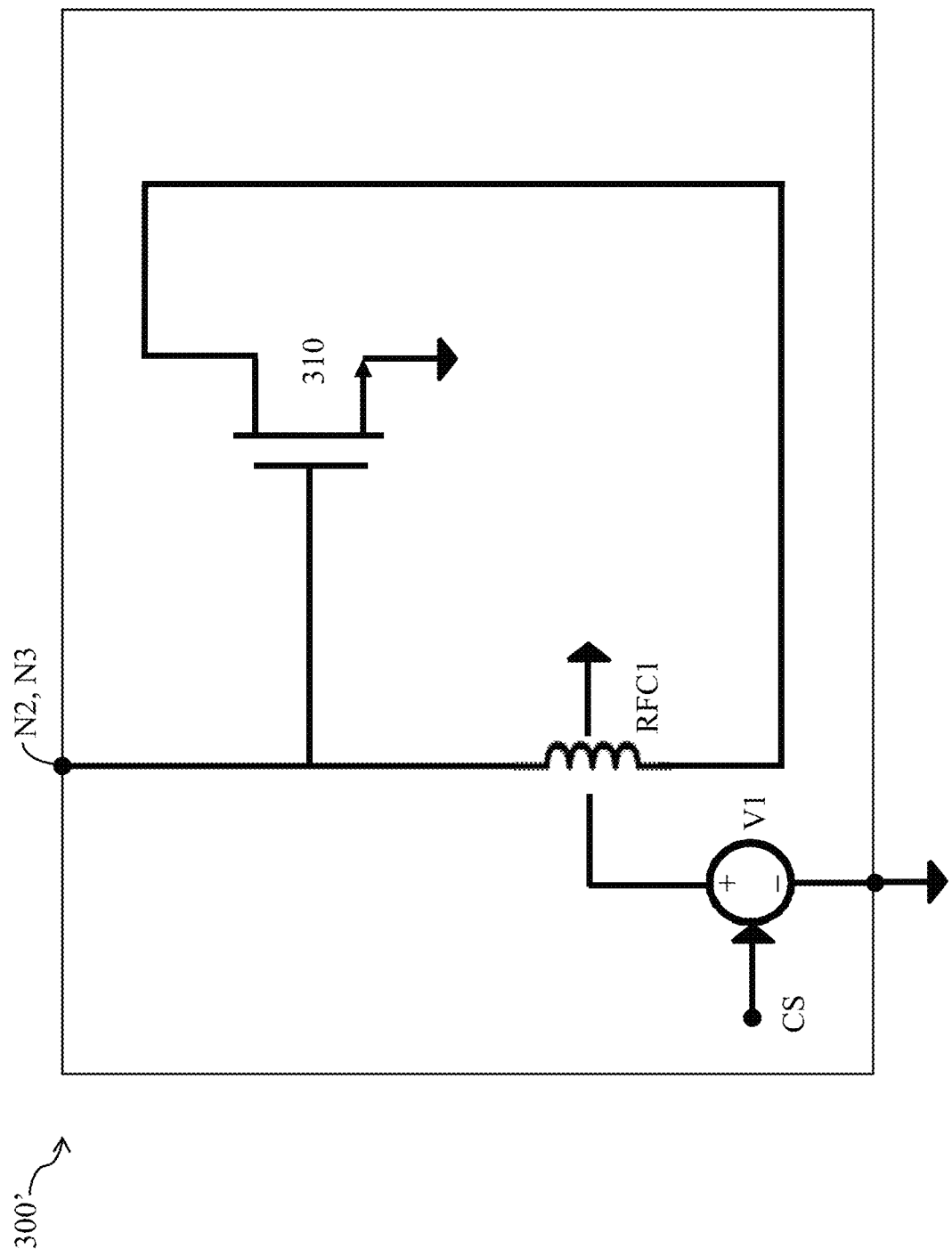
FIG. 3B is a circuit diagram of a circuit usable in the filter in FIG. 3A, in accordance with some embodiments.

FIG. 3B is a circuit diagram of a circuit 300' usable in filter 300 in FIG. 3A, in accordance with some embodiments. Circuit 300' is usable as either first inductor L2 or second inductor L3 (FIG. 3A).

Circuit 300' is configured to receive the set of control signals CS. An equivalent reactance value or equivalent resistance value of circuit 300' is adjusted based on the set of control signals CS. By adjusting the equivalent reactance value or the equivalent resistance value of circuit 300', the gain of filter 300 (e.g., filter 300 (FIG. 3A)) is adjusted.

Circuit 300' includes an n-type transistor 310, a choke circuit RFC1 and an adjustable voltage source V1.

Adjustable voltage source V1 is configured to receive the set of control signals CS. Adjustable voltage source V1 is configured to adjust the voltage provided to n-type transistor 310 based on the set of control signals CS. By adjusting the voltage provided by adjustable voltage source V1 to n-type transistor 310, the equivalent resistance provided by n-type transistor 310 is adjusted which also adjusts the gain of the filter (e.g., filter 300 (FIG. 3A)).

Choke circuit RFC1 is configured to block AC signals (e.g., mixed data signal MO (FIGS. 2A-2B)), while passing DC signals (e.g., voltage provided from adjustable voltage source V1). In some embodiments, choke circuit RFC1 is an RF choke circuit.

A gate terminal of n-type transistor 310 is connected to RF choke circuit RFC1 and second node N2 or third node N3. A source terminal of n-type transistor 310 is connected to a ground voltage (VSS). A drain terminal of n-type transistor 310 is connected to RF choke circuit RFC1. In some embodiments, a p-type transistor is usable in circuit 300'.

Figure 3C:
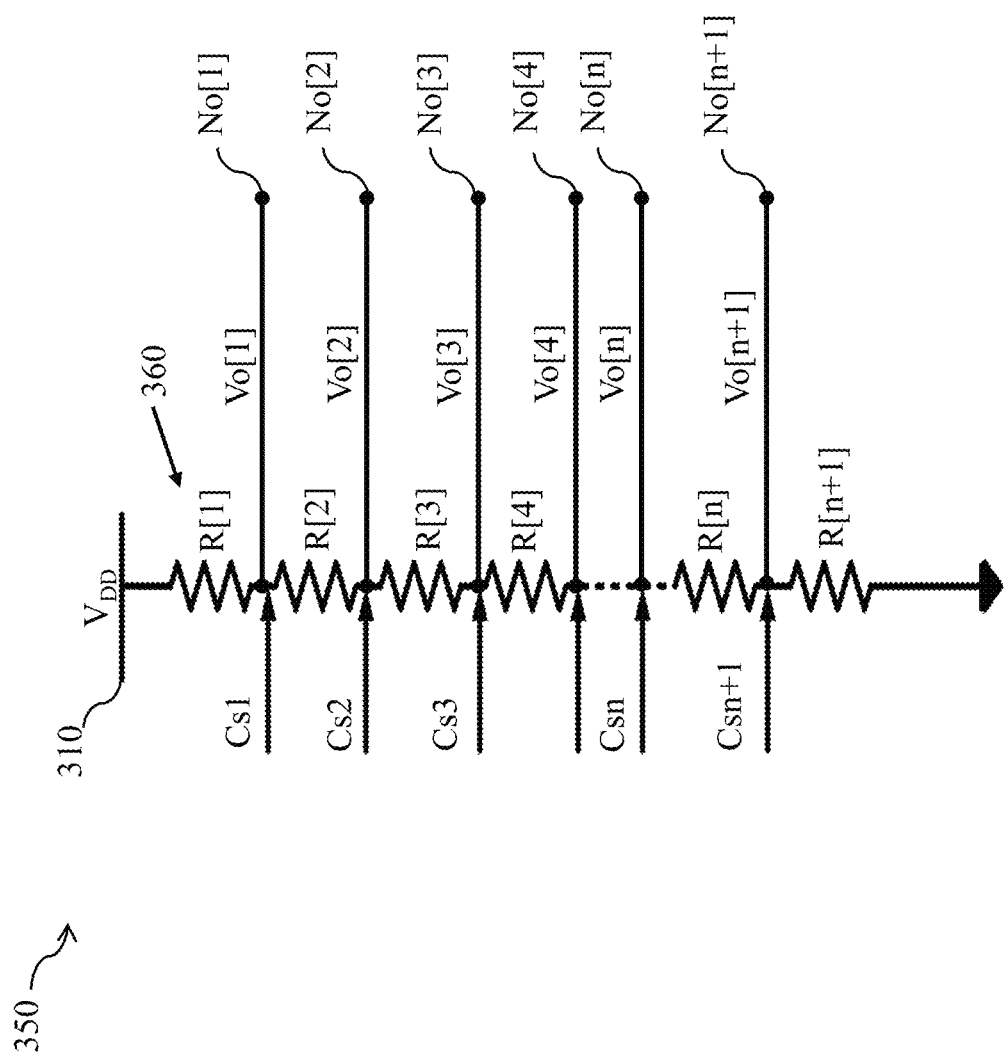
FIG. 3C is a circuit diagram of an adjustable voltage source usable in FIG. 3B, in accordance with some embodiments.

FIG. 3C is a circuit diagram of an adjustable voltage source 350 usable in FIG. 3B, in accordance with some embodiments. Adjustable voltage source 350 is usable as adjustable voltage source V1 (FIG. 3B). In some embodiments, adjustable voltage source 350 is a functional representation of an adjustable voltage source V1 (FIG. 3B). Set of control signals CS1, CS2, and CSn is an embodiment of set of control signals CS (FIGS. 2A-2B).

Adjustable voltage source 350 is configured to provide an adjustable output voltage Vo[1] to Vo[n+1], collectively referred to as output voltages Vo. Adjustable voltage source 350 includes a voltage terminal 310 configured to supply a voltage VDD to resistors R[1] to R[n+1], collectively referred to as resistors 360. Adjustable voltage source 350 is configured to provide output voltages Vo. Adjustable voltage source 350 further includes nodes No[1] to No[n+1], collectively referred to as nodes No. Nodes No for supplying output voltages Vo are located between adjacent resistors 360. Each node of nodes No is configured to supply a corresponding output voltage of output voltages Vo. For example, a node No[1] for supplying output voltage Vo[1] is located between resistor R[1] and resistor R[2]; and a node No[n+1] for supplying output voltage Vo[n+1] is located between resistor R[n] and resistor R[n+1].

Adjustable voltage source 350 is configured to receive a control signal, e.g., a set of control signals CS1, CS2, CSn+1 (collectively referred to as control signals CS) from gain adjusting circuit 208 (FIGS. 2A-2B). In response to the received control signals CS, adjustable voltage source 350 is configured to select a node of the nodes No. Each node of nodes No is configured to supply a corresponding output voltage of output voltages Vo. By selecting a node of the nodes No, the voltage (e.g., output voltage Vo) supplied by adjustable voltage source 350 350 is adjusted. For example, by selecting node No[1], adjustable voltage source 350 is configured to supply output voltage Vo[1] to a load (not shown). For example, by selecting node No[2], adjustable voltage source 350 is configured to supply output voltage Vo[2] to the load (not shown). In some embodiments, control signals CS identifies which node No is selected to provide the output voltage Vout.

In some embodiments, resistors 360 all have a same resistance value. In some embodiments, at least one resistor, e.g., resistor R[1], has a different resistance value from at least one other resistor, e.g., resistor R[2]. In some embodiments, at least one of resistors 360 is a variable resistor subject to active control based on a control signal, e.g., control signals CS.

Figure 4:
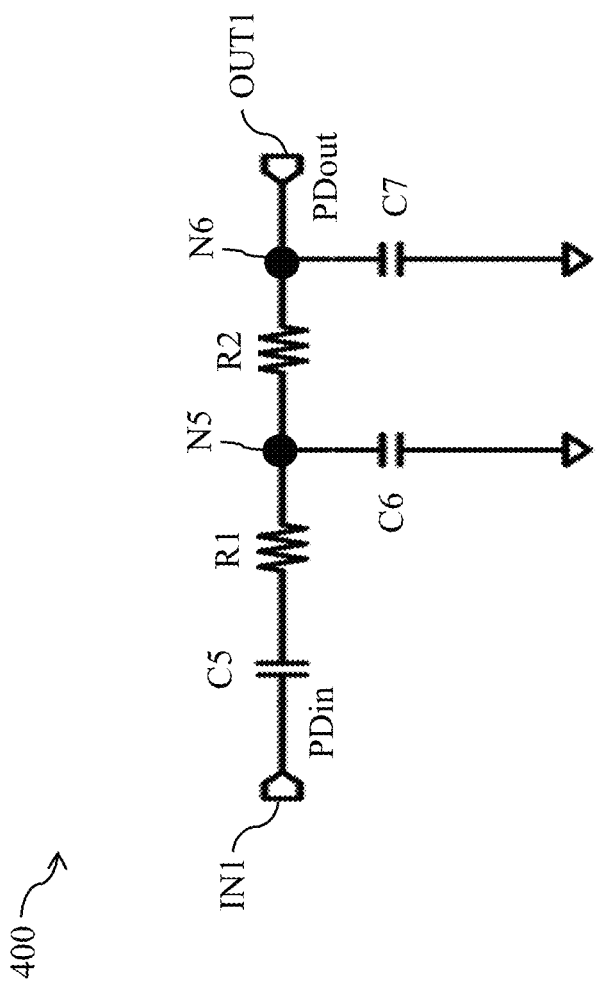
FIG. 4 is a circuit diagram of a peak detector usable in the demodulator in FIGS. 2A-2B, in accordance with some embodiments.

FIG. 4 is a circuit diagram of a peak detector 400 usable in demodulator 200 (FIG. 2A), in accordance with some embodiments. Peak detector 400 is usable as either or both of first peak detector 210 or second peak detector 212 (FIGS. 2A-2B).

Signal PDin is an embodiment of filtered mixed data signal FS, mixed data signal MO or reference signal REF (FIGS. 2A-2B). Signal PDin is an embodiment of signal PD1 or signal PD2 (FIGS. 2A-2B).

Peak detector 400 is configured to receive a signal PDin on input terminal IN1, and configured to output a signal PDout on output terminal OUT1. Peak detector 400 is configured to detect a peak value of signal PDin. Peak detector 400 is configured to output a signal PDout based on signal PDin. Signal PDin is an AC signal. Signal PDout is a DC signal. In some embodiments, signal PDout is a DC signal that corresponds to the peak value of signal PDin. Peak detector 400 is configured as a low pass filter with a slow response time.

Peak detector 400 includes a capacitor C5 connected in series with a resistor R1 and a resistor R2. Peak detector 400 further includes a capacitor C6 and a capacitor C7.

Node N5 connects resistor R1 and resistor R2. Node N6 connects resistor R2 and output terminal OUT2.

Capacitor C6 is connected between a ground terminal and node N5. Capacitor C7 is connected between the ground terminal and node N6. Resistor R1, resistor R2, capacitor C6 and capacitor C7 form a second-order low-pass filter. In some embodiments, peak detector 400 is a low-pass filter of an order different than that shown in FIG. 4.

In some embodiments, at least one of a value of capacitor C5, a value of capacitor C6 or a value of capacitor C7 is equal to at least one of the value of capacitor C5, the value of capacitor C6 or the value of capacitor C7. In some embodiments, at least one of a value of capacitor C5, a value of capacitor C6 or a value of capacitor C7 is different from at least one of the value of capacitor C5, the value of capacitor C6 or the value of capacitor C7. A value of resistor R1 is equal to or different from a value of resistor R2. In some embodiments, capacitor C5, capacitor C6 or capacitor C7 is a MOSCAP.

Figure 5A:
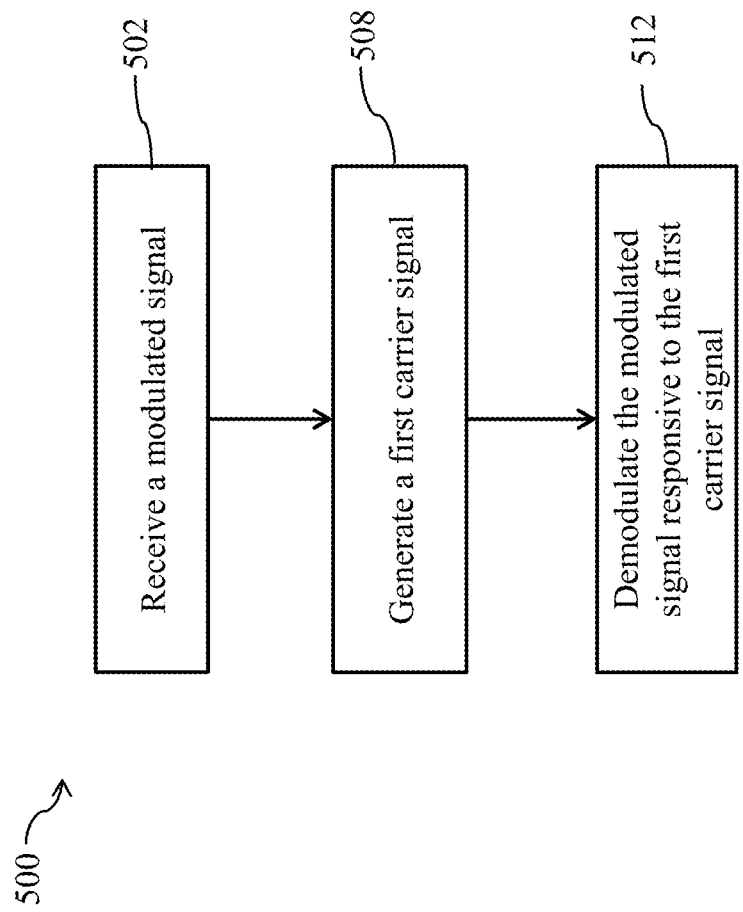
FIG. 5A is a flowchart of a method of data communications from a receiver perspective, in accordance with some embodiments.

FIG. 5A is a flowchart of a method 500 of data communications from a receiver perspective, in accordance with some embodiments. It is understood that additional operations may be performed before, during, and/or after the method 500 depicted in FIG. 5A, and that some other processes may only be briefly described herein.

Method 500 begins with operation 502, where a modulated signal is received through a first transmission line (e.g., first transmission line 130 (FIG. 1)). In this embodiment, the modulated signal is in a form of a pair of differential signals DP' and DN'.

Method 500 continues with operation 508, where a first carrier signal (e.g., first carrier signal CK[1]' (FIG. 1)) is generated (e.g., generated by carrier generator 122 (FIG. 1)). In embodiments in which receiver 120 includes more than one demodulator DM[1] (i.e., N>1), operation 508 is repeated to generate all corresponding carrier signals CK[1]', CK[2]', and CK[N]'.

Method 500 continues with operation 512, where the modulated signal is demodulated responsive to the first carrier signal (e.g., first carrier signal CK[1]' (FIG. 1)), thereby generating a first demodulated data stream (e.g., demodulated data stream DO[1] (FIG. 1)). In embodiments in which receiver 120 includes more than one demodulator DM[1] (i.e., N>1), operation 512 is repeated to generate all corresponding demodulated data streams DO[1], DO[2], and DO[N].

Figure 5B:
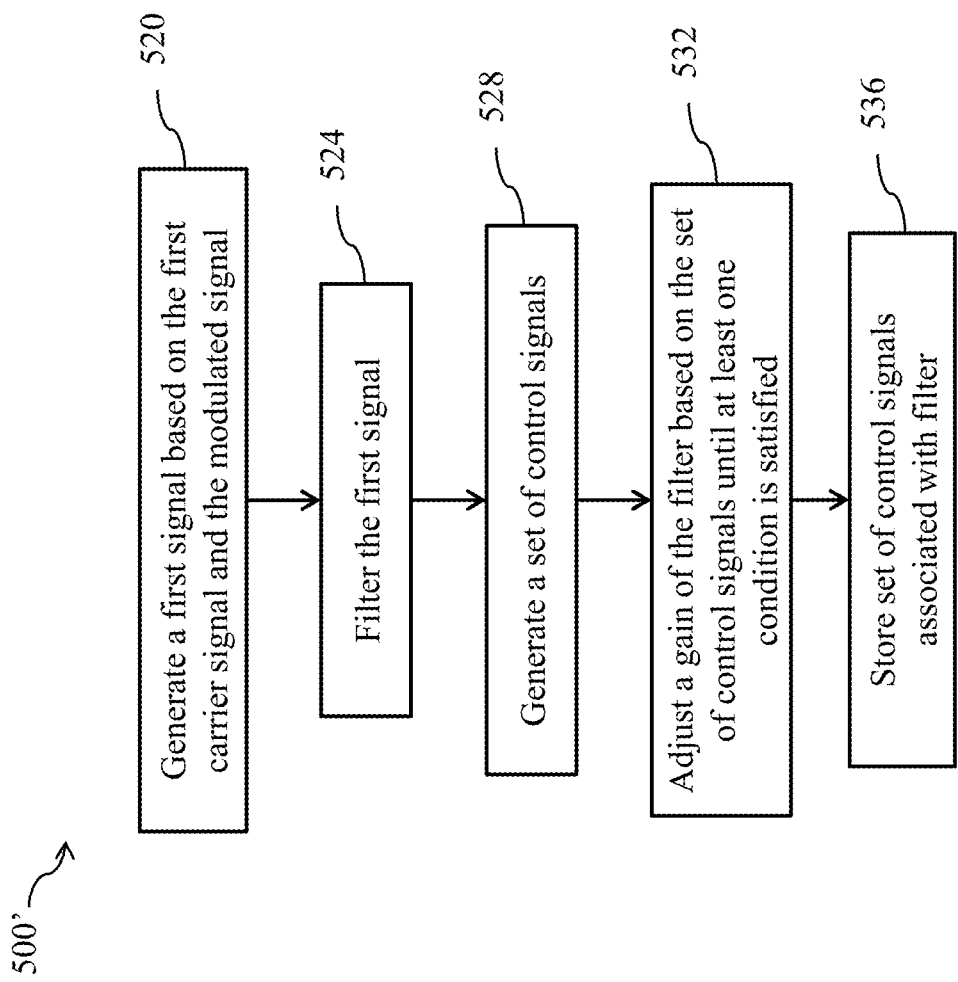
FIG. 5B is a flowchart of a method of demodulating a modulated signal, in accordance with some embodiments.

FIG. 5B is a flowchart of a method 500' of demodulating a modulated signal, in accordance with some embodiments. It is understood that additional operations may be performed before, during, and/or after the method 500' depicted in FIG. 5B, and that some other processes may only be briefly described herein. In embodiments in which receiver 120 includes more than one demodulator DM[1] (i.e., N>1), method 500' is repeated for each corresponding demodulator DM[1], DM[2], DM[N].

Method 500' begins with operation 520 during which a first signal (e.g., mixed data signal MO (FIGS. 2A-2B)) is generated based on the first carrier signal (e.g., first carrier signal CK[1]' (FIG. 1)) and the modulated signal (e.g., amplified modulated signal AMS).

In this embodiment, the modulated signal is in a form of a pair of differential signals DP' and DN'. In this embodiment, the first signal (e.g., mixed data signal MO (FIGS. 2A-2B)) is generated by a mixer (e.g., mixer 202 (FIGS. 2A-2B)).

Method 500' continues with operation 524, where the first signal (e.g., mixed data signal MO (FIGS. 2A-2B)) is filtered by a filter (e.g., filter 206 (FIGS. 2A-2B)). In some embodiments, the filtered first signal (e.g., filtered mixed data signal FS (FIGS. 2A-2B)) having a frequency (e.g., frequency $F_{fs}$ (FIGS. 2A-2B)) less than a first cutoff frequency (e.g., first cutoff frequency $F_{off1}$ (FIG. 2A-2B)) of a filter (e.g., filter 206 (FIGS. 2A-2B)).

Method 500' continues with operation 528, where a set of control signals (e.g., set of control signals CS (FIGS. 2A-2B)) are generated based on a voltage (e.g., voltage $V_{mo}$ or voltage $V_{ref}$ (FIGS. 2A-2B)) of a second signal (e.g., mixed data signal MO or reference signal REF (FIGS. 2A-2B)) or a voltage (e.g., voltage $V_{fs}$ (FIGS. 2A-2B)) of the filtered first signal (e.g., filtered mixed data signal FS (FIGS. 2A-2B)). In some embodiments, the set of control signals (e.g., set of control signals CS (FIGS. 2A-2B)) are generated by a gain adjusting circuit (e.g., gain adjusting circuit 208 (FIGS. 2A-2B)).

Method 500' continues with operation 532, where a gain (e.g., gain G (FIGS. 2A-2B)) of the filter (e.g., filter 206 (FIGS. 2A-2B)) is adjusted based on the set of control signals (e.g., set of control signals CS (FIGS. 2A-2B)).

In some embodiments, the gain (e.g., gain G (FIGS. 2A-2B)) of the filter (e.g., filter 206 (FIGS. 2A-2B)) is adjusted until at least one condition is satisfied. In some embodiments, the at least one condition is satisfied when the voltage (e.g., voltage $V_{mo}$ or voltage $V_{ref}$ (FIGS. 2A-2B)) of the second signal (e.g., mixed data signal MO or reference signal REF (FIGS. 2A-2B)) is equal to the voltage (e.g., voltage $V_{fs}$ (FIGS. 2A-2B)) of the filtered first signal (e.g., filtered mixed data signal FS (FIGS. 2A-2B)).

Method 500' continues with operation 536, where a set of control signals (e.g., set of control signals CS (FIGS. 2A-2B)) associated with the filter (e.g., filter 206 (FIGS. 2A-2B)) are stored in memory (e.g., memory 804 (FIG. 8)).

Figure 6:
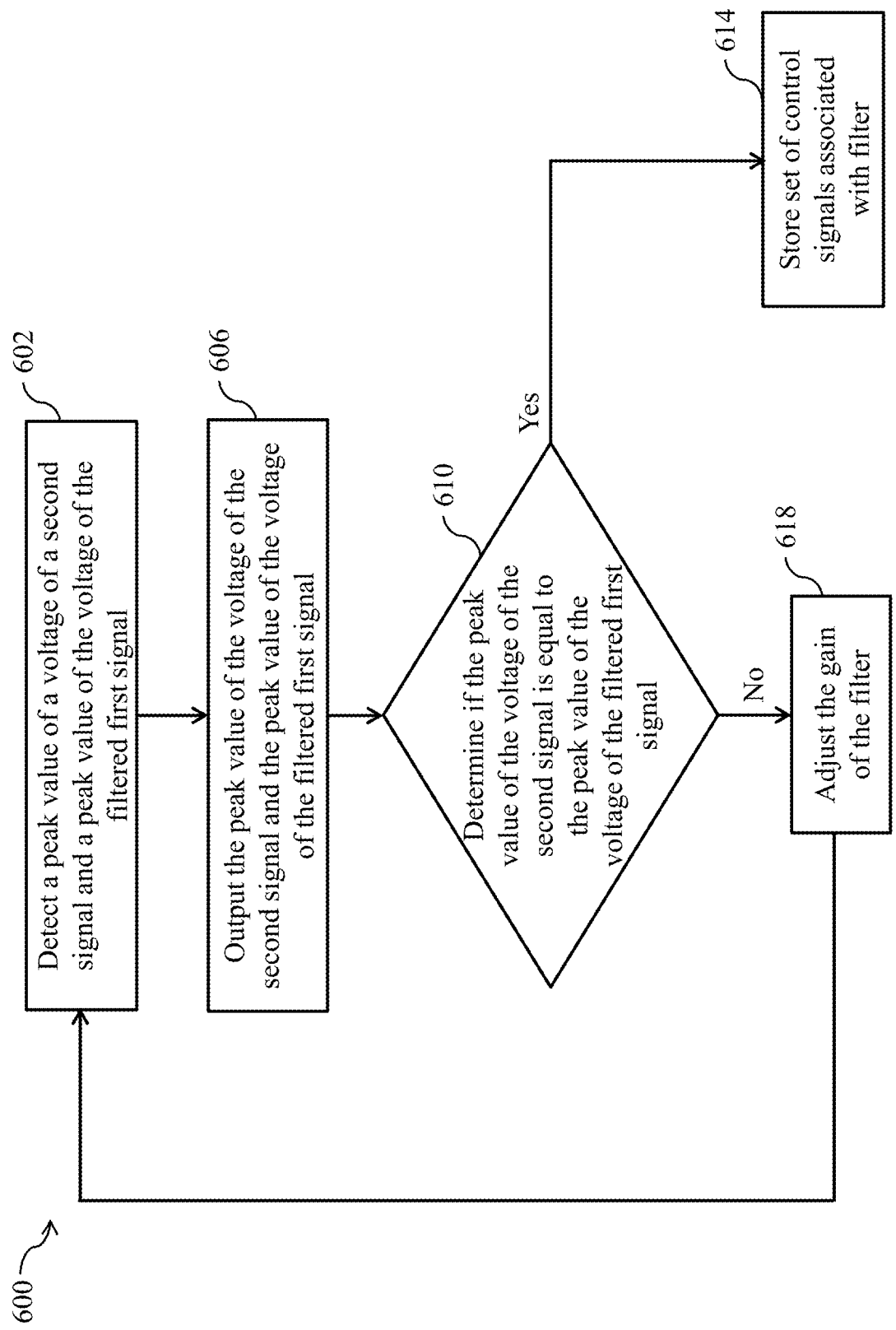
FIG. 6 is a flowchart of a method of generating a set of control signals of a gain adjusting circuit, in accordance with some embodiments.

FIG. 6 is a flowchart of a method 600 of generating a set of control signals of the gain adjusting circuit in FIGS. 2A-2B, in accordance with some embodiments. It is understood that additional operations may be performed before, during, and/or after the method 600 depicted in FIG. 6, and that some other processes may only be briefly described herein. In embodiments in which receiver 120 includes more than one demodulator DM[1] (i.e., N>1), method 600 is repeated for each corresponding demodulator DM[1], DM[2], DM[N].

Method 600 begins with operation 602, where a peak value of a voltage (e.g., voltage $V_{mo}$ or voltage $V_{ref}$ (FIGS. 2A-2B)) of a second signal (e.g., mixed data signal MO or reference signal REF (FIGS. 2A-2B)) or a voltage (e.g., voltage $V_{fs}$ (FIGS. 2A-2B)) of the filtered first signal (e.g., filtered mixed data signal FS (FIGS. 2A-2B)) is detected. In some embodiments, the peak voltage value of operation 602 is detected by a peak detector (e.g., first peak detector 210 (FIG. 2A) or second peak detector 212 (FIG. 2B)).

Method 600 continues with operation 606, where the peak value of the voltage (e.g., voltage $V_{mo}$ or voltage $V_{ref}$ (FIGS. 2A-2B)) of the second signal (e.g., mixed data signal MO or reference signal REF (FIGS. 2A-2B)) or the voltage (e.g., voltage $V_{fs}$ (FIGS. 2A-2B)) of the filtered first signal (e.g., filtered mixed data signal FS (FIGS. 2A-2B)) is output to a comparator (e.g., comparator 214 (FIGS. 2A-2B)).

Method 600 continues with operation 610, where the gain adjusting circuit (e.g., gain adjusting circuit 208 (FIGS. 2A-2B)) determines if the peak value of the voltage (e.g., voltage $V_{mo}$ or voltage $V_{ref}$ (FIGS. 2A-2B)) of the second signal (e.g., mixed data signal MO or reference signal REF (FIGS. 2A-2B)) is equal to the peak value of the voltage (e.g., voltage $V_{fs}$ (FIGS. 2A-2B)) of the filtered first signal (e.g., filtered mixed data signal FS (FIGS. 2A-2B)).

If the gain adjusting circuit (e.g., gain adjusting circuit 208 (FIGS. 2A-2B)) determines that the peak value of the voltage (e.g., voltage $V_{mo}$ or voltage $V_{ref}$ (FIGS. 2A-2B)) of the second signal (e.g., mixed data signal MO or reference signal REF (FIGS. 2A-2B)) is equal to the voltage (e.g., voltage $V_{fs}$ (FIGS. 2A-2B)) of the filtered first signal (e.g., filtered mixed data signal FS (FIGS. 2A-2B)), the operation proceeds to operation 614.

If the gain adjusting circuit (e.g., gain adjusting circuit 208 (FIGS. 2A-2B)) determines that the peak value of the voltage (e.g., voltage $V_{mo}$ or voltage $V_{ref}$ (FIGS. 2A-2B)) of the second signal (e.g., mixed data signal MO or reference signal REF (FIGS. 2A-2B)) is not equal to the voltage (e.g., voltage $V_{fs}$ (FIGS. 2A-2B)) of the filtered first signal (e.g., filtered mixed data signal FS (FIGS. 2A-2B)), the operation proceeds to operation 618.

In some embodiments, operation 610 includes outputting a comparative output signal (e.g., signal C1 (FIGS. 2A-2B))

based on the relationship between the peak value of the voltage (e.g., voltage $V_{mo}$ or voltage $V_{ref}$ (FIGS. 2A-2B)) of the second signal (e.g., mixed data signal MO or reference signal REF (FIGS. 2A-2B)) and the voltage (e.g., voltage $V_{fs}$ (FIGS. 2A-2B)) of the filtered first signal (e.g., filtered mixed data signal FS (FIGS. 2A-2B)). Comparative output signal (e.g., signal C1 (FIGS. 2A-2B)) is a logical low signal or a logical high signal.

Method 500 continues with operation 614, where a set of control signals (e.g., set of control signals CS (FIGS. 2A-2B)) associated with the filter (e.g., filter 206 (FIGS. 2A-2B)) are stored in memory (e.g., memory 804 (FIG. 8)). Operation 614 is an embodiment of operation 536 (FIG. 5B).

Method 500 continues with operation 618, where the gain (e.g., gain G (FIGS. 2A-2B)) of the filter (e.g., filter 206 (FIGS. 2A-2B)) is adjusted based on the set of control signals (e.g., set of control signals CS (FIGS. 2A-2B)). Operation 618 is an embodiment of operation 532 (FIG. 5B).

FIG. 7 is a flowchart of a method 700 of adjusting a gain of the filter in FIG. 3A, in accordance with some embodiments. It is understood that additional operations may be performed before, during, and/or after the method 700 depicted in FIG. 7, and that some other processes may only be briefly described herein. In embodiments in which receiver 120 includes more than one demodulator DM[1] (i.e., N>1), method 700 is repeated for each corresponding demodulator DM[1], DM[2], DM[N].

Method 700 begins with operation 702, where a DC voltage signal (e.g., voltage signal from adjustable voltage source V1 (FIG. 3B)) is set based on a set of control signals (e.g., set of control signals CS (FIGS. 2A-2B)).

Method 700 continues with operation 706, where the DC voltage signal (e.g., voltage signal from adjustable voltage source V1 (FIG. 3B)) is passed and a first signal (e.g., mixed data signal MO (FIGS. 2A-2B)) is blocked or filtered by an RF choke circuit (e.g., RF choke circuit RFC1 (FIG. 3B)).

Method 700 continues with operation 710, where an amplitude of the first signal (e.g., mixed data signal MO (FIGS. 2A-2B)) is adjusted based on the DC voltage signal (e.g., voltage signal from adjustable voltage source V1 (FIG. 3B)).

By using demodulators DM[1], DM[2] and DM[N] (FIG. 1) or demodulator 200 (FIGS. 2A-2B), the gain (e.g., gain G (FIGS. 2A-2B)) of a filter (e.g., filters Filter$_1$, Filter$_2$, and Filter$_N$(FIG. 1), filter 208 (FIGS. 2A-2B), filter 300 (FIG. 3A)) is adjusted to overcome any signal distortion attributed to PVT variations. In some embodiments, the the gain (e.g., gain G (FIGS. 2A-2B)) of a filter (e.g., filters Filter$_1$, Filter$_2$, and Filter$_N$ (FIG. 1), filter 208 (FIGS. 2A-2B), filter 300 (FIG. 3A)) is automatically adjusted or automatically calibrated to overcome any signal distortion attributed to PVT variations. By using method 500 (FIG. 5A), method 500' (FIG. 5B), method 600 (FIG. 6) or method 700 (FIG. 7), the gain (e.g., gain G (FIGS. 2A-2B)) of a filter (e.g., filters Filter$_1$, Filter$_2$, and Filter$_N$ (FIG. 1), filter 208 (FIGS. 2A-2B), filter 300 (FIG. 3A)) is adjusted to overcome any signal distortion attributed to PVT variations.

Figure 8:
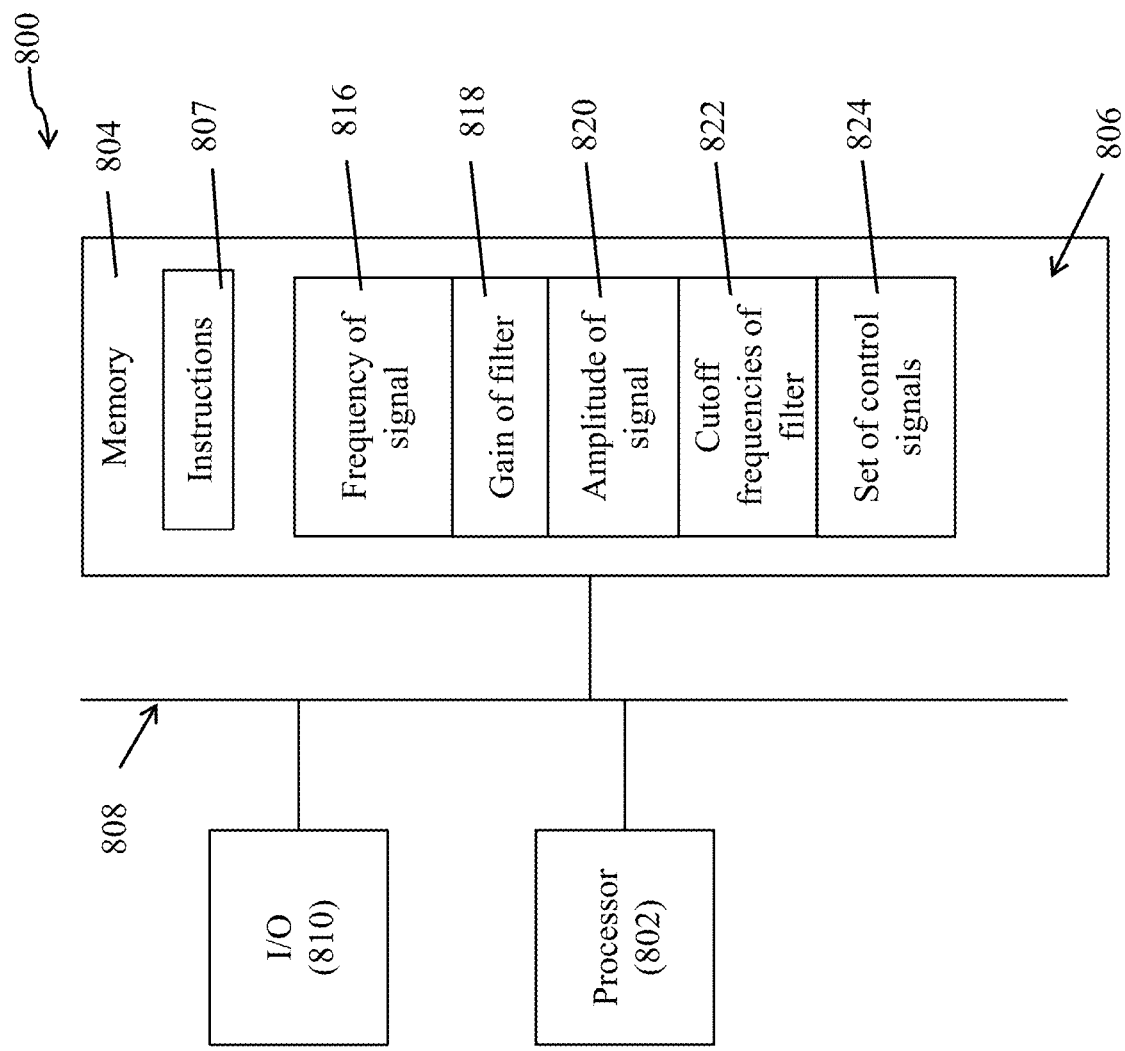
FIG. 8 is a block diagram of a controller usable in the gain adjusting circuit in FIGS. 2A-2B, in accordance with some embodiments.

FIG. 8 is a block diagram of a controller 800 usable in the gain adjusting circuit 208 in FIGS. 2A-2B, in accordance with some embodiments. In some embodiments, the controller 800 is an embodiment of the controller 216 shown in gain adjusting circuit 208 (FIGS. 2A-2B). In some embodiments, the controller 800 is a computing device which implements at least a portion of method 500 of FIG. 5A, method 500' of FIG. 5B, method 600 of FIG. 6 or method 700 of FIG. 7 in accordance with one or more embodiments. Controller 800 includes a hardware processor 802 and a non-transitory, computer readable storage medium 804 encoded with, i.e., storing, the computer program code 806, i.e., a set of executable instructions. Computer readable storage medium 804 is also encoded with instructions 807 for interfacing with the filter (e.g., filters Filter$_1$, Filter$_2$, and Filter$_N$ (FIG. 1), filter 206 (FIGS. 2A-2B)) for adjusting the gain (e.g., gain G (FIGS. 2A-2B)) of the filter (e.g., gain adjusting circuit 208 (FIGS. 2A-2B)). The processor 802 is electrically coupled to the computer readable storage medium 804 via a bus 808. The processor 802 is also electrically coupled to an I/O interface 810 by bus 808. The processor 802 is configured to execute the computer program code 806 encoded in the computer readable storage medium 804 in order to cause controller 800 to be usable for performing a portion or all of the operations as described e.g., in methods 500, 500', 600 and 700.

In one or more embodiments, the processor 802 is a central processing unit (CPU), a multi-processor, a distributed processing system, an application specific integrated circuit (ASIC), and/or a suitable processing unit. The processor 802 is an embodiment of controller 216 (FIGS. 2A-2B).

In one or more embodiments, the computer readable storage medium 804 is an electronic, magnetic, optical, electromagnetic, infrared, and/or a semiconductor system (or apparatus or device). For example, the computer readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer readable storage medium 804 includes a compact disk-read only memory (CD-ROM), a compact disk-read/write (CD-R/W), and/or a digital video disc (DVD).

In one or more embodiments, the storage medium 804 stores the computer program code 806 configured to cause controller 800 to perform method 500, 500', 600 or 700. In one or more embodiments, the storage medium 804 also stores information needed for performing method 500, 500', 600 or 700 as well as information generated during performing method 500, 500', 600 or 700, such as frequency of signal 816, gain of filter 818, amplitude of signal 820, cutoff frequencies of filter 822, set of control signals 824, and/or a set of executable instructions to perform the operation of method 500, 500', 600 or 700.

In one or more embodiments, the storage medium 804 stores instructions 807 for interfacing with external machines. The instructions 807 enable processor 802 to generate instructions readable by the external machines to effectively implement method 500, 500', 600 or 700 during a gain adjusting process of a filter.

Controller 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802. Controller 800 is configured to receive information related to a UI through I/O interface 810. The information is transferred to processor 802 via bus 808 to generate a set of control signals to adjust the gain of the filter. The UI is then stored in computer readable medium 804 as a request to adjust the gain of the filter by a set of control signals 824. Controller 800 is configured to receive information related to a frequency of a signal through I/O interface 810. The information is stored in computer readable medium 804 as frequency of signal 816. Controller 800 is configured to receive information related to a gain of the filter through I/O interface 810. The information is stored in computer readable medium 804 as gain of filter 818. Controller 800 is configured to receive information related to an amplitude of the signal through I/O interface 810. The information is stored in computer readable medium 804 as amplitude of the signal 820. Controller 800 is configured to receive information related to cutoff frequencies of the filter through I/O interface 810. The information is stored in computer readable medium 804 as cutoff frequencies of the filter 822.

In some embodiments, frequency of signal 816 includes a frequency $F_{fs}$ of the filtered mixed data signal FS (FIGS. 2A-2B) or a frequency $F_{mo}$ of the mixed data signal MO (FIGS. 2A-2B). In some embodiments, gain of filter 818 includes gain G of filter 206 (FIGS. 2A-2B). In some embodiments, amplitude of signal 820 includes a voltage amplitude $V_{fs}$ of the filtered mixed data signal FS (FIGS. 2A-2B), a voltage amplitude $V_{mo}$ of the mixed data signal MO (FIGS. 2A-2B) or a reference voltage amplitude $V_{ref}$ of the reference signal REF (FIGS. 2A-2B). In some embodiments, cutoff frequencies of filter 822 include first cutoff frequency $F_{off1}$ of filter 206 and second cutoff frequency $F_{off2}$ of filter 206 (FIGS. 2A-2B). In some embodiments, set of control signals 824 include set of control signals CS (FIGS. 2A-2B).

One aspect of this description relates to a communication system. The communication system includes a transmitter configured to transmit a modulated signal, a transmission line configured to carry the modulated signal, and a receiver configured to receive the modulated signal, and being coupled to the transmitter by the transmission line. In some embodiments, the transmitter includes a modulator configured to receive a data signal, and to generate the modulated signal responsive to the data signal and a carrier signal. In some embodiments, the receiver includes a demodulator configured to demodulate the modulated signal responsive to a first carrier signal. In some embodiments, the demodulator includes a filter configured to generate a filtered first signal based on a first signal, the first signal being based on the first carrier signal and the modulated signal, the filter having a gain controlled by a set of control signals. In some embodiments, the demodulator further includes a gain adjusting circuit coupled to the filter, and configured to adjust the gain of the filter, and to generate the set of control signals based on a voltage of the filtered first signal and a voltage of the first signal. In some embodiments, the gain adjusting circuit includes a first peak detector coupled to the filter, and configured to detect a peak value of the voltage of the filtered first signal.

Another aspect of this description relates to a communication system. The communication system includes a transmitter configured to transmit a modulated signal, a transmission line configured to carry the modulated signal, and a receiver configured to receive the modulated signal, and being coupled to the transmitter by the transmission line. In some embodiments, the transmitter includes a modulator configured to receive a data signal, and to generate the modulated signal responsive to the data signal and a carrier signal. In some embodiments, the receiver includes a demodulator configured to demodulate the modulated signal responsive to a first carrier signal. In some embodiments, the demodulator includes a mixer configured to generate a first signal based on the first carrier signal and the modulated signal. In some embodiments, the demodulator further includes a filter coupled to the mixer, and configured to generate a filtered first signal based on the first signal, the filter having a gain controlled by a set of control signals. In some embodiments, the demodulator further includes a gain adjusting circuit coupled to the filter, and configured to adjust the gain of the filter, and to generate the set of control signals based on a voltage of the filtered first signal and a voltage of the first signal. In some embodiments, the gain adjusting circuit includes a first peak detector coupled to the filter, and configured to detect a peak value of the voltage of the filtered first signal.

Still another aspect of this description relates to a method of data communications. The method includes demodulating a modulated signal responsive to a first carrier signal, thereby generating a demodulated data stream. In some embodiments, demodulating the modulated signal includes generating a first signal in response to mixing the first carrier signal and the modulated signal; generating, by a filter, a filtered first signal based on the first signal; generating a set of control signals based on a voltage of the filtered first signal and a voltage of the first signal. In some embodiments, generating the set of control signals includes detecting a peak value of the voltage of the filtered first signal, and adjusting a gain of the filter based on the set of control signals.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A communication system, comprising:
 a transmitter configured to transmit a modulated signal, the transmitter comprising:
  a modulator configured to receive a data signal, and to generate the modulated signal responsive to the data signal and a carrier signal;
 a transmission line configured to carry the modulated signal; and
 a receiver configured to receive the modulated signal, and being coupled to the transmitter by the transmission line, the receiver comprising:

a demodulator configured to demodulate the modulated
   signal responsive to a first carrier signal, the
   demodulator comprising:
   a filter configured to generate a filtered first signal
      based on a first signal, the first signal being based
      on the first carrier signal and the modulated signal,
      the filter having a gain controlled by a set of
      control signals; and
   a gain adjusting circuit coupled to the filter, and
      configured to adjust the gain of the filter, and to
      generate the set of control signals based on a
      voltage of the filtered first signal and a voltage of
      the first signal, the gain adjusting circuit comprising:
      a first peak detector coupled to the filter, and
         configured to detect a peak value of the voltage
         of the filtered first signal.

2. The communication system of claim 1, wherein the gain adjusting circuit further comprises:
   a second peak detector configured to detect a peak value of the voltage of the first signal.

3. The communication system of claim 2, wherein the gain adjusting circuit further comprises:
   a comparator coupled to the first peak detector and the second peak detector, and being configured to generate a comparator output signal based on the peak value of the voltage of the filtered first signal and the peak value of the voltage of the first signal.

4. The communication system of claim 3, wherein the gain adjusting circuit further comprises:
   a controller configured to receive a reference clock signal and the comparator output signal, and configured to generate the set of control signals based on the reference clock signal and the comparator output signal, and being coupled between the comparator and the filter.

5. The communication system of claim 4, wherein the first peak detector or the second peak detector comprises:
   an input node;
   an output node;
   a first resistive circuit including a first end and a second end;
   a second resistive circuit including a first end and a second end, the first end of the second resistive circuit and the second end of the first resistive circuit being coupled to each other, the second end of the second resistive circuit and the output node being coupled to each other;
   a first capacitive circuit coupled between the input node and the first end of the first resistive circuit;
   a second capacitive circuit coupled between
      a reference voltage supply, and
      the second end of the first resistive circuit and the first end of the second resistive circuit; and
   a third capacitive circuit coupled between
      the reference voltage supply, and
      the second end of the second resistive circuit and the output node.

6. The communication system of claim 1, wherein the transmitter further comprises:
   a first carrier generator coupled to the modulator, and configured to generate the carrier signal.

7. The communication system of claim 6, wherein the receiver further comprises:
   a second carrier generator coupled to the demodulator, and configured to generate the first carrier signal.

8. The communication system of claim 1, wherein the filter has one of the following configurations:
   the filter comprising a band pass filter having a center frequency, the center frequency of the band pass filter being less than a first cutoff frequency of the filter, and the center frequency of the band pass filter being greater than a second cutoff frequency of the band pass filter, the second cutoff frequency being less than the first cutoff frequency; or
   the filter comprising a low pass filter, the low pass filter having a center frequency equal to 0 hertz.

9. A communication system, comprising:
   a transmitter configured to transmit a modulated signal, the transmitter comprising:
      a modulator configured to receive a data signal, and to generate the modulated signal responsive to the data signal and a carrier signal;
   a transmission line configured to carry the modulated signal; and
   a receiver configured to receive the modulated signal, and being coupled to the transmitter by the transmission line, the receiver comprising:
      a demodulator configured to demodulate the modulated signal responsive to a first carrier signal, the demodulator comprising:
         a mixer configured to generate a first signal based on the first carrier signal and the modulated signal;
         a filter coupled to the mixer, and configured to generate a filtered first signal based on the first signal, the filter having a gain controlled by a set of control signals; and
         a gain adjusting circuit coupled to the filter, and configured to adjust the gain of the filter, and to generate the set of control signals based on a voltage of the filtered first signal and a voltage of the first signal, the gain adjusting circuit comprising:
            a first peak detector coupled to the filter, and configured to detect a peak value of the voltage of the filtered first signal.

10. The communication system of claim 9, the transmitter further comprises:
    a first carrier generator coupled to the modulator, and configured to generate the carrier signal.

11. The communication system of claim 9, wherein the filter comprises:
    an input node;
    a first node;
    a second node;
    a first capacitive circuit coupled between the input node and the first node;
    a first inductive circuit coupled between the first node and a reference voltage supply node;
    a second capacitive circuit coupled between the first node and the second node; and
    an adjustable inductive circuit coupled between the second node and the reference voltage supply node, and configured to receive the set of control signals.

12. The communication system of claim 11, wherein the adjustable inductive circuit comprises:
    a radio frequency (RF) choke coupled to at least the second node, configured to pass a direct current (DC) voltage, and configured to block the first signal;
    an adjustable voltage supply configured to set the DC voltage based on the set of control signals, and being coupled to the RF choke; and a transistor configured to attenuate an amplitude of the first signal based on the DC voltage, the transistor being coupled to the RF choke and the second node.

13. The communication system of claim 12, wherein the transistor comprises:
   a gate terminal coupled to a first end of the RF choke and the second node;
   a drain terminal coupled to a second end of the RF choke; and
   a source terminal coupled to the reference voltage supply node.

14. The communication system of claim 9, wherein the gain adjusting circuit further comprises:
   a second peak detector configured to detect a peak value of the voltage of the first signal.

15. The communication system of claim 14, wherein the gain adjusting circuit further comprises:
   a comparator coupled to the first peak detector and the second peak detector, and being configured to generate a comparator output signal based on the peak value of the voltage of the filtered first signal and the peak value of the voltage of the first signal.

16. The communication system of claim 15, wherein the gain adjusting circuit comprises:
   a controller configured to receive a reference clock signal and the comparator output signal, and configured to generate the set of control signals based on the reference clock signal and the comparator output signal, and being coupled between the comparator and the filter.

17. A method of data communications, comprising:
   demodulating a modulated signal responsive to a first carrier signal, thereby generating a demodulated data stream, wherein demodulating the modulated signal comprises:
      generating a first signal in response to mixing the first carrier signal and the modulated signal;
      generating, by a filter, a filtered first signal based on the first signal;
      generating a set of control signals based on a voltage of the filtered first signal and a voltage of the first signal, wherein generating the set of control signals comprises:
         detecting a peak value of the voltage of the filtered first signal; and
      adjusting a gain of the filter based on the set of control signals.

18. The method of data communications of claim 17, wherein generating the set of control signals further comprises:
   detecting a peak value of the voltage of the first signal;
   outputting the peak value of the voltage of the first signal; and
   outputting the peak value of the voltage of the filtered first signal.

19. The method of data communications of claim 18, wherein generating the set of control signals further comprises:
   generating a comparative output signal based on comparing:
      the peak value of the voltage of the filtered first signal; and
      the peak value of the voltage of the first signal.

20. The method of data communications of claim 17, wherein adjusting the gain of the filter based on the set of control signals comprises:
   setting a direct current (DC) signal based on the set of control signals;
   passing the DC signal and blocking the first signal; and
   attenuating an amplitude of the first signal based on the DC signal.

* * * * *